United States Patent
Dupuis et al.

(10) Patent No.: US 9,912,413 B1
(45) Date of Patent: Mar. 6, 2018

(54) ELECTRO-OPTIC PHASE MODULATOR WITH NO RESIDUAL AMPLITUDE MODULATION

(71) Applicant: INTERNATIONAL BUSINESS MACHINES CORPORATION, Armonk, NY (US)

(72) Inventors: Nicolas Dupuis, New York, NY (US); Benjamin G. Lee, Ridgefield, CT (US); Marc A. Taubenblatt, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/249,182

(22) Filed: Aug. 26, 2016

(51) Int. Cl.
H04B 10/00 (2013.01)
H04B 10/548 (2013.01)
H03C 7/00 (2006.01)

(52) U.S. Cl.
CPC ............ H04B 10/548 (2013.01); H03C 7/00 (2013.01)

(58) Field of Classification Search
CPC ... H04B 10/516; H04B 10/541; H04B 10/505
See application file for complete search history.

(56) References Cited

U.S. PATENT DOCUMENTS

| | | | |
|---|---|---|---|
| 6,842,285 B2 | 1/2005 | Glückstad | |
| 7,167,293 B2 | 1/2007 | Piede | |
| 8,634,678 B2 | 1/2014 | Lee et al. | |
| 9,310,185 B2 | 4/2016 | Soler et al. | |
| 2009/0257755 A1* | 10/2009 | Buelow | H04B 10/505 398/184 |
| 2011/0158576 A1* | 6/2011 | Kissa | G02F 1/225 385/3 |
| 2013/0202306 A1 | 8/2013 | Middleton et al. | |
| 2014/0334764 A1* | 11/2014 | Galland | G02F 1/225 385/3 |

(Continued)

FOREIGN PATENT DOCUMENTS

WO 2009022969 A1 2/2009

OTHER PUBLICATIONS

Li et al., "Measurement and Control of Residual Amplitude Modulation in Optical Phase Modulation", American Institute of Physics, Review of Scientific Instruments 83,043111 (2012).

*Primary Examiner* — Dzung Tran
(74) *Attorney, Agent, or Firm* — Intelletek Law Group, PLLC; Gabriel Daniel, Esq.

(57) ABSTRACT

An optical phase modulator includes an input source that is configured to receive a light source. There is an output operative to provide a phase modulated output signal based on the received light source. There is a first optical coupler configured to split the light source into a first optical path of a Mach Zehnder Interferometer (MZI) and a second optical path of the MZI. A static phase shifter is configured to provide a static phase shift to the first optical path. There is a phase modulator in the second optical path. There is a second optical coupler configured to combine the first optical path and the second optical path. The first and second optical couplers are tuned such that the phase modulated optical signal at the output provides a substantially constant amplitude that is independent of a change in loss introduced by the phase modulator.

24 Claims, 9 Drawing Sheets

(56) References Cited

U.S. PATENT DOCUMENTS

2016/0109734 A1    4/2016  Porte et al.
2016/0246157 A1*   8/2016  Dumais ................ G02F 1/2257
2016/0306201 A1*  10/2016  Saeedi .................... G02B 6/38

* cited by examiner

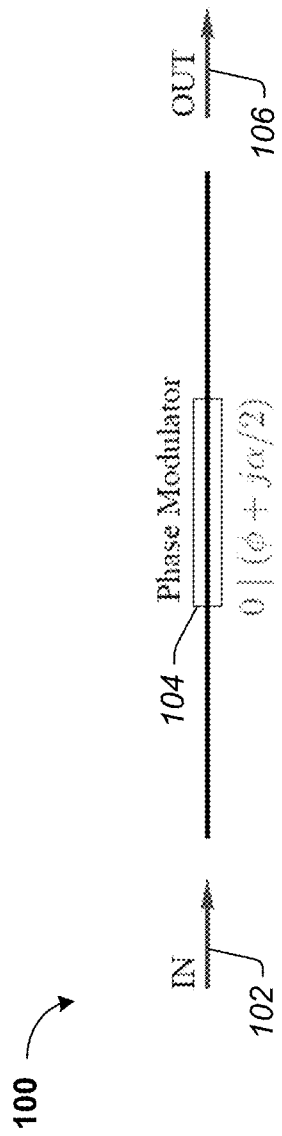
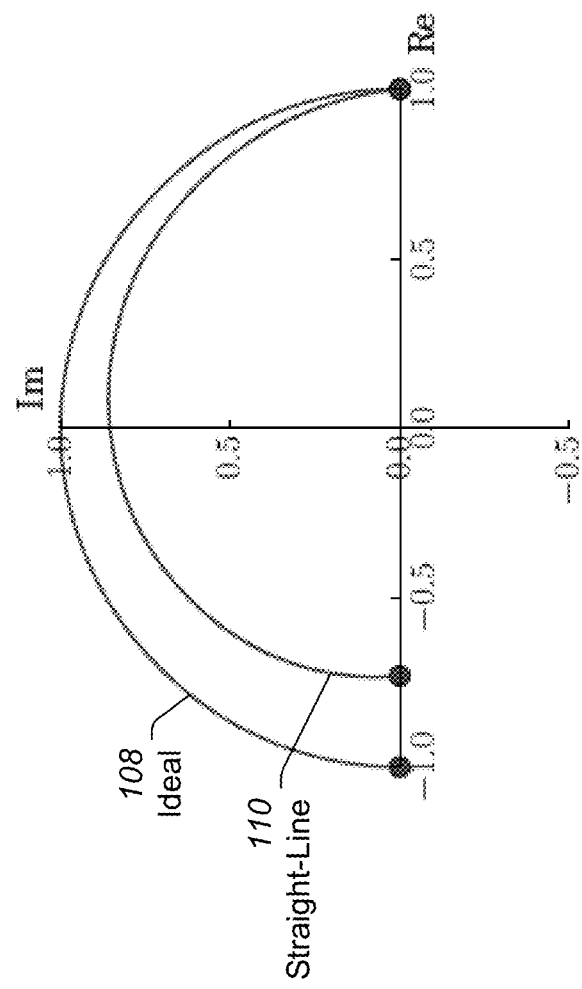
FIG. 1A: Prior Art
FIG. 1B: Prior Art

ELECTRO-OPTIC PHASE MODULATOR WITH NO RESIDUAL AMPLITUDE MODULATION

BACKGROUND

Technical Field

The present application generally relates to optical modulators to control light signals, and more particularly, to optical phase modulators with controlled residual amplitude modulation.

Description of the Related Art

An electro-optic modulator is an optoelectronic device where a signal-controlled element having an electro-optic effect is used to modulate a beam of light. The modulation may be with respect to the phase, frequency, amplitude, or polarization of the beam of light. Electro-optic phase modulators are largely used in fiber optical communication systems for realizing high-speed phase modulation of optical signals. Various technologies and material platforms can be used to realize a phase modulator. The structure generally includes an optical waveguide that has a refractive index that is modulated by applying an RF electrical field that spatially overlaps with an optical mode of the waveguide.

After propagating through an L-long phase modulator, an input optical signal with a wavelength λ typically experiences a phase variation provided by equation 1 below:

$$\Delta\phi = (2\pi/\lambda)\Delta nL \qquad \text{(Eq. 1)}$$

where,
$\Delta\phi$ is the phase variation, and
$\Delta n$ is the refractive index change due to the applied electric field.

Phase modulators can be used in various applications. For example, they can be used as straight-line elements to modulate the phase of an optical signal. They can also be embedded in Mach-Zehnder structures or resonant structures to realize advanced-modulation transmitters or optical switches. A Mach-Zehnder interferometer (MZI) is a structure that splits a light beam in two optical signals that are phase-modulated relative to each other and then recombined.

It is generally desirable to provide pure phase modulation without any residual amplitude modulation, which could be detrimental to the system. However, any modulation of the refractive index is accompanied by a modulation of the amplitude. This property follows the Kramers-Kronig equations, which are bidirectional mathematical relations that relate the real and imaginary parts of a system having a linear response, such as the dielectric function of a material. The residual amplitude modulation of phase modulators is a salient issue for several applications including, without limitation, optical isolators, optical switches, and advanced imaging techniques such as optical coherence tomography.

SUMMARY

According to various embodiments, an optical phase modulator and a system are provided for optical switching. There is an input port that is configured to receive a light source. There is an output operative to provide a phase modulated output signal based on the received light source. There is a first optical coupler configured to split the light source into a first optical path of a Mach Zehnder Interferometer (MZI) and a second optical path of the MZI. A static phase shifter is configured to provide a static phase shift to the first optical path. There is a phase modulator in the second optical path. There is a second optical coupler configured to combine the first optical path and the second optical path. The first and second optical couplers are tuned such that the phase modulated optical signal at the output provides a substantially constant amplitude that is independent of a change in loss introduced by the phase modulator.

According to one exemplary embodiment, there is an optical phase modulator that comprises a cascade of a plurality of optical phase modulators.

According to one embodiment, there is an optical switch that includes a first input port and a second input port. There is an output comprising a first output port and a second output port. There is a first optical coupler configured to combine a signal from the first input port and a signal from the second input port. There is a second optical coupler coupled to a first output of the first optical coupler and configured to split a signal of the first output of the first optical coupler into a first optical path of an upper Mach Zehnder Interferometer (MZI) and a second optical path of the upper MZI. There is a first static phase shifter configured to provide a static phase shift to the second optical path of the upper MZI. There is a first phase modulator in the first optical path of the upper MZI. There is a third optical coupler configured to combine the first optical path and the second optical path of the upper MZI. There is a fourth optical coupler coupled to a second output of the first optical coupler and configured to split a signal of the second output of the first optical coupler into a first optical path of a lower MZI and a second optical path of the lower MZI. There is a second static phase shifter configured to provide a static phase shift to the first optical path of the lower MZI. There is a second phase modulator in the second optical path of the lower MZI. There is a fifth optical coupler configured to combine the first optical path and the second optical path of the lower MZI. There is a sixth optical coupler configured to combine an output of the third optical coupler and an output of the fifth optical coupler. The second, third, fourth, and fifth optical couplers are adjusted such that the phase modulators embedded in the lower and upper MZI structures modulate the optical phase of the signals at the first and second outputs of the first optical coupler and provide a substantially constant amplitude that is independent of an insertion loss variation introduced by the first and an insertion loss variation of the second phase modulator.

According to one embodiment, there is an optical switch that includes an input comprising a first input port and a second input port. There is an output comprising a first output port and a second output port. There is a first optical coupler configured to combine a signal from the first input port and the second input port. There is a second optical coupler coupled to a first output of the first optical coupler and configured to split a signal of the first output of the first optical coupler into a first optical path of an upper Mach Zehnder Interferometer (MZI) and a second optical path of the upper MZI. There is a first phase modulator in the first optical path of the upper MZI. There is a first static phase shifter configured to provide a static phase shift to the second optical path of the upper MZI. There is a third optical coupler configured to combine the first optical path and the second optical path of the upper MZI. There is a loss compensator coupled to a second output of the first optical coupler and configured to match an amplitude loss incurred on the upper MZI. There is a fourth optical coupler configured to combine an output of the third optical coupler and an output of the loss compensator. The second and third optical couplers are adjusted such that the phase modulator embedded in the upper MZI modulate the optical phase of the signal at the first output of the first optical coupler and provides a substantially constant amplitude that is independent of an insertion loss variation introduced by the first phase modulator.

According to one embodiment, there is a method of modulating the phase of an optical signal in a Mach Zehnder Interferometer (MZI) having a first optical path, a second optical path, a phase modulator in the second optical path, a first optical coupler at an input of the MZI, and a second optical coupler at an output of the MZI. An input signal is split by the first optical coupler into the first optical path and the second optical path. The first optical path is heated such that it provides a static phase shift to the first optical path. The phase in the second optical path is modulated via a phase modulator. An output of the first optical path and an output of the second optical path are combined by the second optical coupler. A coupling coefficient of the first optical coupler and a coupling coefficient of the second optical coupler are tuned such that an output of the second optical coupler provides a substantially constant amplitude that is independent of a change in loss introduced by the phase modulator.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 1A illustrates a typical straight-line phase modulator.

FIG. 1B illustrates a phase diagram of the phase modulator of FIG. 1A.

Figure 2A:
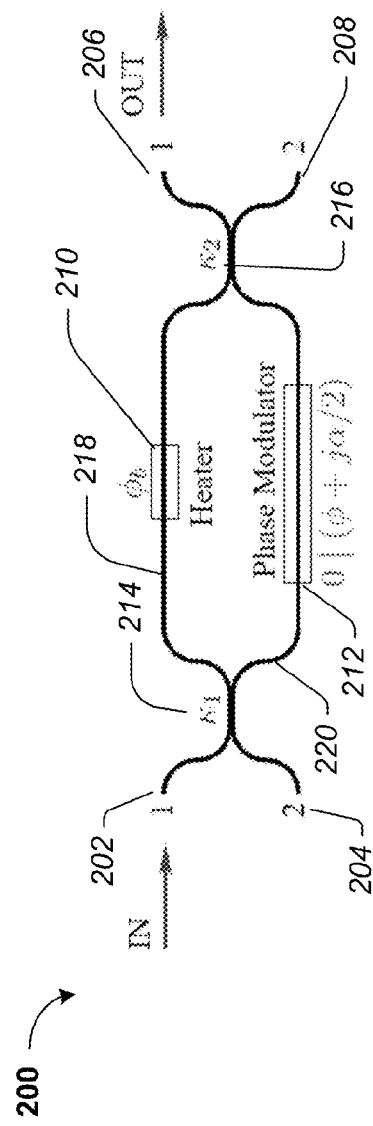
FIG. 2A illustrates a Mach-Zehnder phase modulator that has no residual amplitude modulation, consistent with an exemplary embodiment.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to optical modulators to control light signals. The concepts discussed herein can be used in different applications, including photonic technology platforms that have an electro-optic effect. A phase modulator is embedded into a Mach-Zehnder interferometer structure that has power splitters and phase bias elements tuned to enable a constant insertion loss regardless what the phase of the modulator is. In one aspect, insertion loss is traded for uniformity across the phase space. Such tradeoff is beneficial in many applications, including telecom modulators and optical switches. By virtue of using a single electro-optic modulator, the footprint of the phase modulator can be kept relatively small, which lends itself to various integration applications. The techniques described herein may be implemented in a number of ways. Reference now is made in detail to the examples illustrated in the accompanying drawings and discussed below.

To better appreciate the concepts discussed herein, it may be instructive to discuss a known phase modulator to provide a comparison to the concepts discussed herein. To that end, FIG. 1A illustrates a typical straight-line phase modulator 100 configured to modulate a beam of light carrying a signal at its input 102 with a phase modulator 104, thereby providing a phase modulated version of the signal at its output 106.

FIG. 1B illustrates a phase diagram of the phase modulator 100 of FIG. 1A. Ideally, as the phase is shifted, there should be no modulation in amplitude, as illustrated by the ideal curve 108. In practice, however, the phase modulator 100 exhibits amplitude modulation as the phase is modulated, as illustrated in the straight line curve 110. Accordingly, the phase modulator 100A includes residual amplitude modulation, which is detrimental in many applications.

FIG. 2A illustrates a Mach-Zehnder phase modulator (MZPM) 200 that has no residual amplitude modulation, consistent with an exemplary embodiment. The MZPM 200 includes a 2×2 input port 202 and 204 configured to receive an input source at the first input port 202. There are first and second output ports 206 and 208. The first output port 206 is configured to provide a phase modulated output signal based on the received light source at the first input port 202. There is a first optical coupler 214 configured to split the light source into a first optical path 218 and a second optical path 220 of a Mach Zehnder Interferometer (MZI). There is a thermo-optical phase shifter (e.g., a heater) 210 configured to provide a static phase shift to the first optical path 218. Put differently the heater 210 is a thermo-optic phase shifter that is configured to set a phase bias $\phi_b$. The heater 210 may be implemented using any appropriate technology, including resistive heating and thermoelectric effect heating. In one embodiment, the heater could be replaced by any other type of fixed or tunable phase shifter (e.g. electro-optic) or a fixed extra path length.

The MZPM includes a phase modulator 212 in the second optical path 220. The swing in phase is provided by equation 2 below:

$$\text{Phase Swing} = (\phi + j\alpha/2) \quad (\text{Eq. 2})$$

where,
$\alpha$ is the loss coefficient incurred by the phase modulator electro-optic effect.

The second optical coupler 216 is configured to combine the first optical path 218 and the second optical path 220. Each coupler has its corresponding power coupling coefficient $\kappa 1$ and $\kappa 2$, respectively. The first and second optical couplers are tuned via their coupling coefficients $\kappa 1$ and $\kappa 2$, respectively, such that the phase modulated optical signal at the first output 206 provides a substantially constant amplitude that is independent of a change in loss introduced by the phase modulator 212.

Figure 2B:
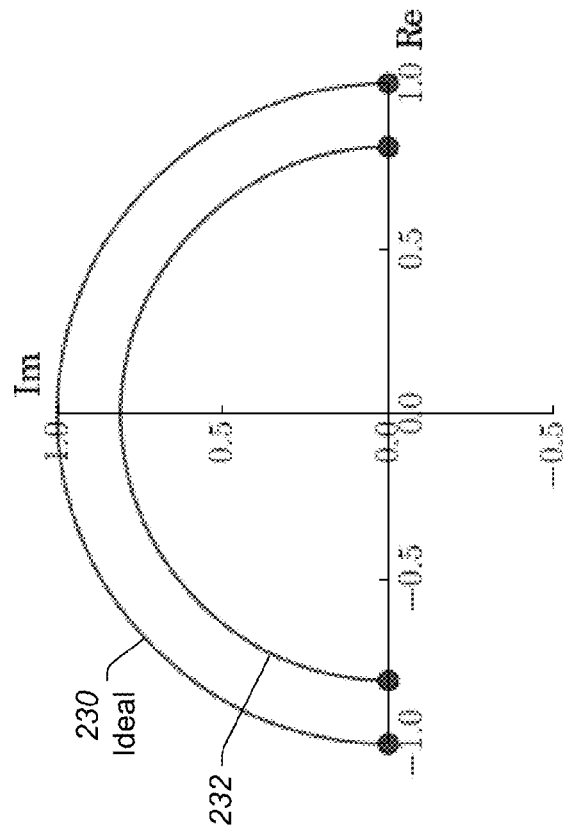
FIG. 2B illustrates a phase diagram of the Mach-Zehnder phase modulator of FIG. 2A.

In this regard, FIG. 2B illustrates a phase diagram of the MZPM 200 of FIG. 2A. Ideally, as the phase is shifted, there should be no modulation in amplitude, as illustrated by the ideal curve 230. Curve 232 represents the signal at the output port (e.g., 206 or 208) of the tunable MZPM 200 of FIG. 2A. As the phase is modulated, there is no additional insertion loss and no residual amplitude modulation. Rather, the amplitude remains substantially stable as the phase is varied. Such substantially constant amplitude is achieved without the requirement of additional phase modulators, which provides a simple and low power phase modulator. Thus, in contrast to known phase modulators, where the amplitude varies with phase, the teachings herein describe architectures where the insertion loss is substantially constant over phase variation.

For example, a light signal enters the first input source 202 of the MZPM 200. This light signal is split by a first optical coupler 214 having a power coupling coefficient $\kappa 1$, into two optical paths 218 and 220. In one embodiment, the phase between the two paths 218 and 220 is adjusted relative to each other using a heater 210 that provides a $\phi_b$ static phase shift. The high-speed phase modulator swings from 0 to $(\phi + j\alpha/2)$. The second optical coupler 216 having a coupling coefficient $\kappa 2$ recombines the first path 218 and the second path 220 of the MZPM 200.

While a 2×2 coupler is illustrated in FIG. 2 by way of example, it should be understood that other configurations are supported by the teachings herein as well, such as a 1×2 coupler and a 2×1 coupler, for the input and output, respectively. In one embodiment, a 2×2 configuration MZPM provides two additional ports for monitoring the device.

In one embodiment, the heater 210 and the phase modulator 212 could be flipped. For example, the heater 210 would be below the phase modulator 212 on a semiconductor.

The phase modulator 212 may be a high-speed phase modulator. It may be implemented from any type of electro-optic modulator that has a residual absorption (e.g., loss) coefficient $\alpha$ when a voltage or a current is applied. For example, the phase modulator can be implemented using the Pockels effect in Lithium Niobate (LN) waveguide devices; the Franz-Keldysh (FK) or Quantum-Confined Stark Effect (QCSE) in III-V waveguide devices; or the free-carrier plasma dispersion (FCD) effect in silicon waveguide devices. Following Kramers-Kronig relations, the stronger the index variation the stronger the absorption. Accordingly, the concepts discussed herein may be particularly useful for devices with strong electro-optic effects, including without limitation, FK modulators, QCSE modulators, or FCD modulators operated in carrier-injection mode.

The values for the optical coupling coefficients may be based on the loss coefficient $\alpha$ of the phase modulator 212. In an extreme and ideal case, if $\alpha=0$, it is desirable to recover the straight-line phase modulator design. Accordingly, both coupling coefficients $\kappa 1$ and $\kappa 2$ may be set to 1. For an $\alpha$ of non-zero, parameters $\kappa 1$, $\kappa 2$, and $\phi_b$ may be selected to keep the overall insertion loss of the MZPM constant when tuning the phase $\phi$. In this regard, the parameters may be chosen such that the interference at the output coupler 216 of the MZPM 200 is imperfect when $\phi=0$, leading to some light leakage at the unused second port 208. When increasing the value of $\phi$, the loss $\alpha$ also increases. However, the light leakage at the second port 208 diminishes, thereby keeping the overall insertion loss of the MZPM constant. The general condition to have constant insertion loss and the desired phase shift $\phi$ for the MZPM is provided by equation 3 below:

$$T_{11}(\phi + j\alpha/2) = T_{11}(0) \exp(j\phi) \quad (\text{Eq. 3})$$

where,
$T_{11}$ is the transmission coefficient of the MZPM from the first input port 202 to the first output port 206.

Equation 3 above can also be written in the form of equation 4 below, which can be used to determine the power coupling coefficients $\kappa_1$, $\kappa_2$, and the phase bias $\phi_b$ of the heater 210:

$$\sqrt{\kappa_1 \kappa_2} e^{j\phi}(1 - e^{-\alpha \Gamma L/2}) + \sqrt{(1-\kappa_1)(1-\kappa_2)} e^{j\phi_b}(1 - e^{j\phi}) = 0 \quad (\text{Eq. 4})$$

where,
$\phi$ is the phase shift of the phase modulator,
$\alpha$ is the absorption coefficient of the phase modulator,
$\Gamma$ is an optical mode confinement factor,
$\kappa_1$ is the coupling coefficient of the first coupling element,
$\kappa_2$ is the coupling coefficient of the second coupling element,
$\phi_b$ is the phase bias, and
L is the length of the phase modulator.

Figure 3:
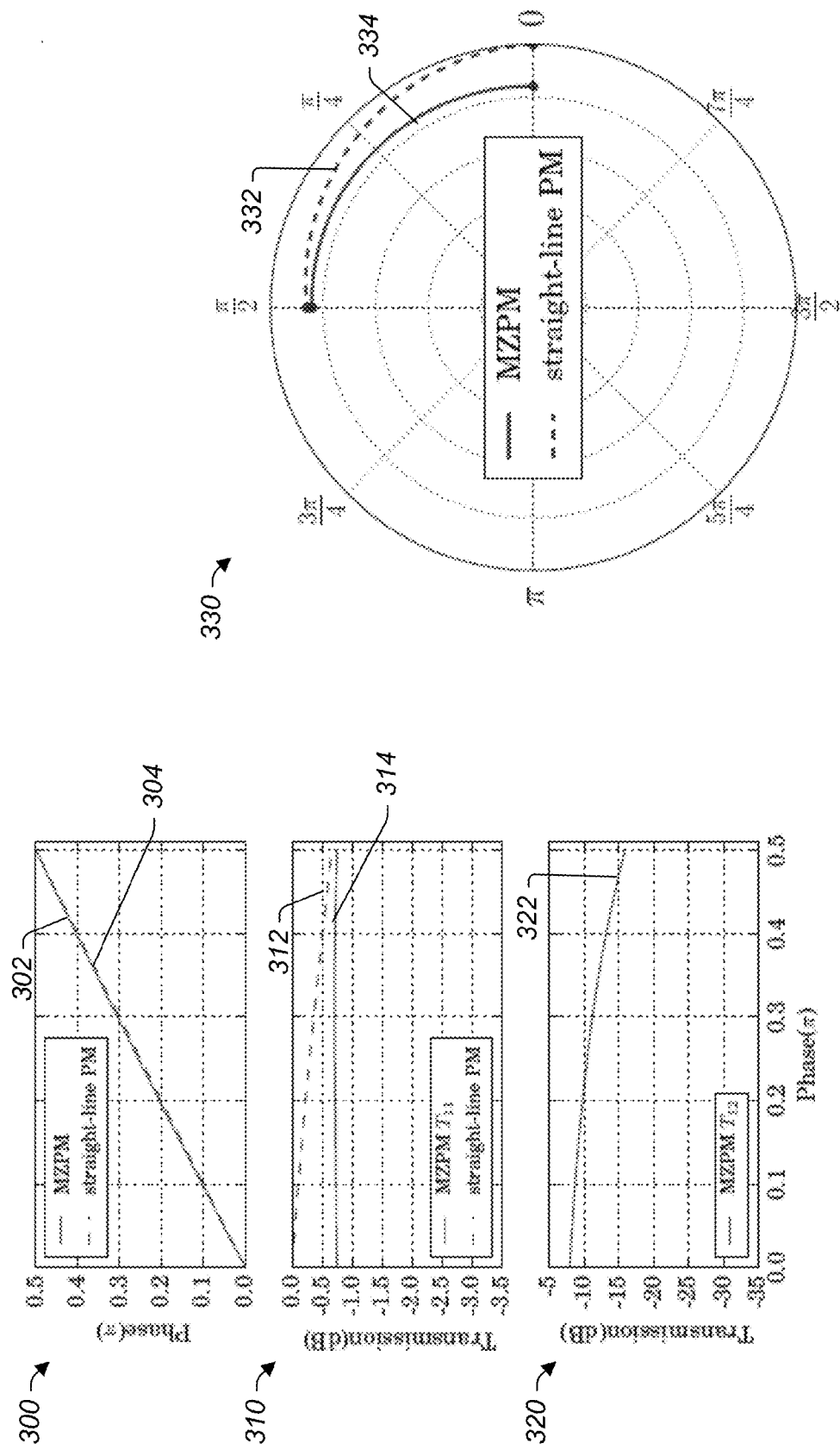
FIG. 3 illustrates simulation results for an optical phase modulator configured to swing from 0 to $\pi/2$, consistent with an exemplary embodiment.
Figure 4:
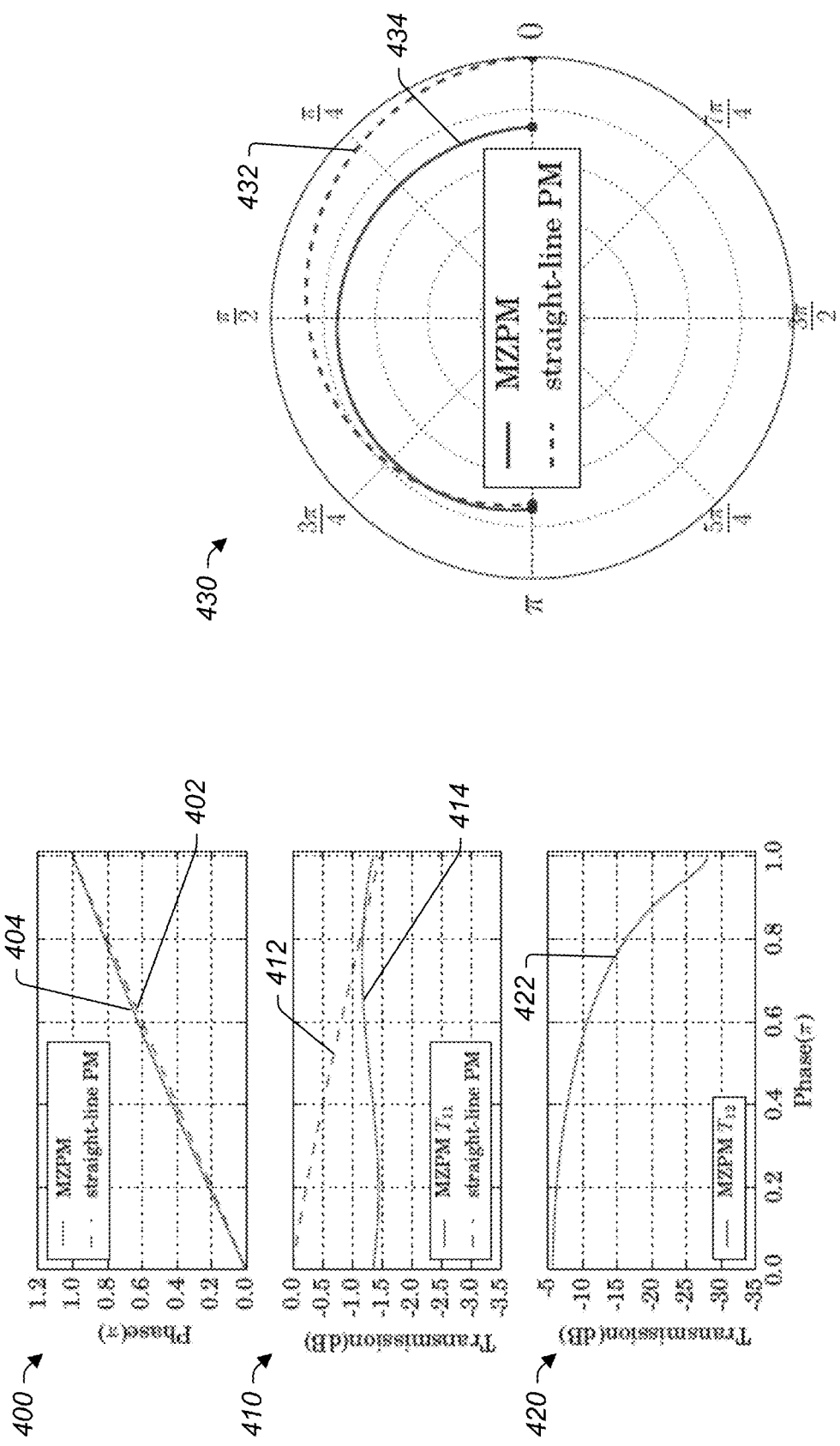
FIG. 4 illustrates simulation results for an optical phase modulator configured to swing from 0 to $\pi$, consistent with an exemplary embodiment.

With the foregoing overview of some salient equations, it may be helpful to provide some graphical simulation results of various example phase modulators. To that end, FIGS. 3 and 4 illustrate simulation results for two silicon photonic MZPMs that use FCD modulators operated in carrier-injection mode. FIG. 3 illustrates example simulation results for an optical phase modulator configured to swing from 0 to $\pi/2$. By way of demonstrative example only and not by way of limitation, the phase modulator of FIG. 3 is configured as $\pi/2$ optical phase modulator, and has the following parameters:

$\phi = -\pi/2$,
$\alpha = 8.6$ cm$^{-1}$,
$\Gamma = 0.7$,
$\kappa_1 = 0.951$,
$\kappa_2 = 0.951$,
$\Phi_b = \pi/4$,
modulator length L=250 µm, and
input wavelength $\lambda = 1.31$ µm.

FIG. 4 illustrates the simulation results for an optical phase modulator configured to swing from 0 to $\pi$. By way of demonstrative example only and not by way of limitation, the phase modulator of FIG. 4 is configured as a π modulator and has the following parameters:

$\phi=-\pi$,
$\alpha=19.3$ cm$^{-1}$,
$\Gamma=0.7$,
$\kappa_1=0.928$,
$\kappa_2=0.928$,
$\phi_b=0$,
modulator length L=250 μm, and
input wavelength λ=1.31 μm.

In the example of FIGS. 3 and 4, the optimum values for $\kappa_1$, $\kappa_2$, and $\phi_b$ are computed by solving Eq. 4 above. The losses of the FCD modulator, which may be due to the free-carrier absorption, may be calculated using Soref empirical equations. For example, at a wavelength of 1.3 μm:

$$\Delta n = -6.2\times10^{-22}\Delta N - 6.0\times10^{-18}\Delta N^{0.8}, \text{ and}$$

$$\Delta\alpha = (6.0\times10^{-18} + 4.0\times10^{-18})\Delta N,$$

where,
Δn is the refractive index change,
Δα is the change in absorption (in cm$^{-1}$), and
ΔN is the carrier density change (in cm$^{-3}$).

Graph 300 illustrates the phase variation of the MZPM versus a straight-line phase modulator (similar to that of FIG. 1A). Graph 300 illustrates that in the phase range investigated, the phase variation of the MZPM 304 is substantially similar to the phase variation of the straight-line phase modulator 302 (i.e., represented by the dashed line) as indicated by virtue of both lines 302 and 304 substantially overlapping.

Graph 310 illustrates both the transmission $T_{11}$ of the MZPM, represented by the solid line 314, and the transmission of a straight-line phase modulator, represented by the dashed line 312. Here, the insertion loss of the MZPM 314, having a φ=0 and φ=π/2, is substantially equal (e.g., relatively constant at approximately −0.75 dB), while the insertion loss of the straight line phase shifter 312 increases as the phase is varied.

Graph 320 illustrates the light leakage emanating out of the second output port 208 of FIG. 2A. Accordingly, as the phase increases, the leakage decreases.

Graph 330 illustrates a comparison of the modulation constellation between a straight-line phase modulator and the MZPM. For a straight-line phase modulator 332, the amplitude varies as the phase is varied from 0 to π. In contrast, the MZPM 334 has an amplitude that stays substantially constant.

Similar simulation results are obtained in the MZPM of FIG. 4, which swings in phase from 0 to π. Graph 400 illustrates that the phase variation of the MZPM 404 is substantially similar to the phase variation of the straight-line phase modulator 402 (i.e., represented by the dashed line) in that both lines substantially overlap. Graph 400 illustrates that the phase of the MZPM 404 has some slight non-linearity that may be corrected if the modulator is used as an analog component. However, if the modulator is used for digital communications this non-linearity may be unimportant.

Graph 410 illustrates that the insertion loss of the MZPM 414, is substantially equal (e.g., relatively constant in the range of −1.1 dB and −1.4 dB) while the insertion loss of the straight-line phase modulator 412 increases as the phase is varied. The insertion loss of the MZPM of FIG. 4 is substantially similar at φ=0 and φ=π. Between those values of 0, the π modulator varies by only about 0.3 dB. It should be noted that in some scenarios (e.g., in analog applications), such variation in loss may be slightly non-uniform for different phases. However, these variations are typically unimportant if the MZPM is used as a digital phase modulator.

Graph 420 illustrates the light leakage at the second output port 208 of FIG. 2A. Similar to graph 320 of the π/2 modulator, as the phase increases in the π modulator, the leakage decreases.

Graph 430 illustrates a comparison of the modulation constellation between a straight-line phase modulator and the MZPM. For a straight-line phase modulator 432, the amplitude varies as the phase is varied from 0 to π. In contrast, the MZPM 434 has an amplitude that stays substantially constant.

Figure 5:
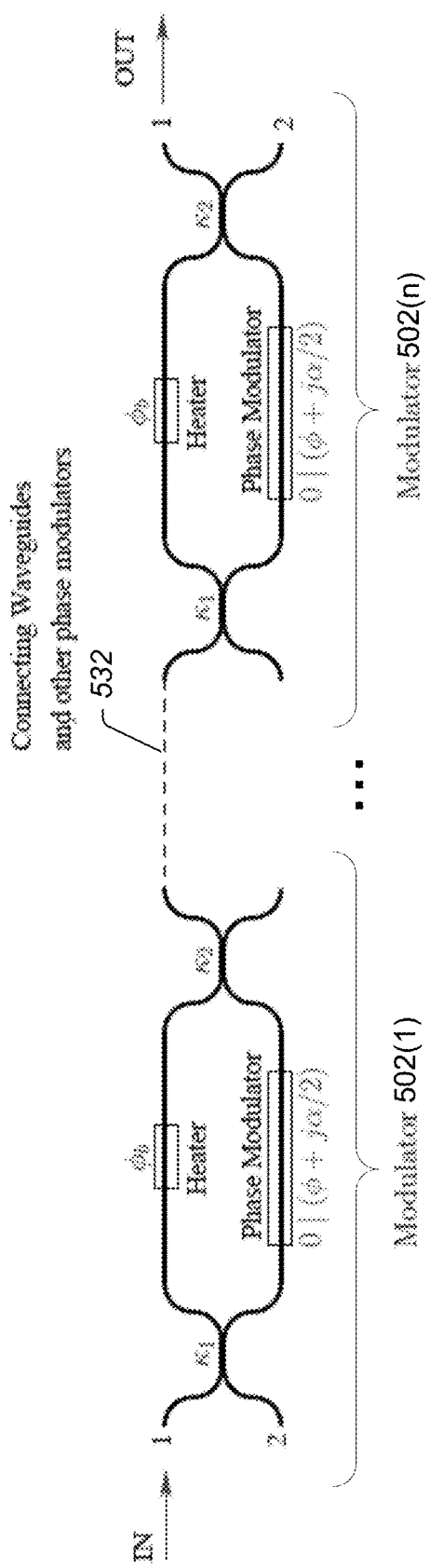
FIG. 5 illustrates a plurality of Mach-Zehnder phase modulators that have been cascaded, consistent with an exemplary embodiment.

In various embodiments, the MZPM discussed herein can be implemented in a nested architecture, cascaded architecture, or a combination thereof. To that end, FIG. 5 illustrates a plurality of MZPMs (i.e., 502(1) to 502(n)) that have been cascaded, consistent with an exemplary embodiment. For example, each MZPM (e.g., 502(1) to 502(n)) may be similar to that of FIG. 2A and is connected to its adjacent MZPM via a connecting waveguide 532. By virtue of cascading multiple MZPM's, the small analog amplitude modulation discussed in the context of FIG. 4 can be avoided. For example, for a π phase modulator architecture, one can cascade two π/2 MZPM blocks. For a 2π modulator, one can cascade four π/2 blocks or two π blocks. Of course, in view of the concepts discussed herein, other cascade combinations are supported as well, such as various combinations of π/2 and π blocks.

Figure 6:
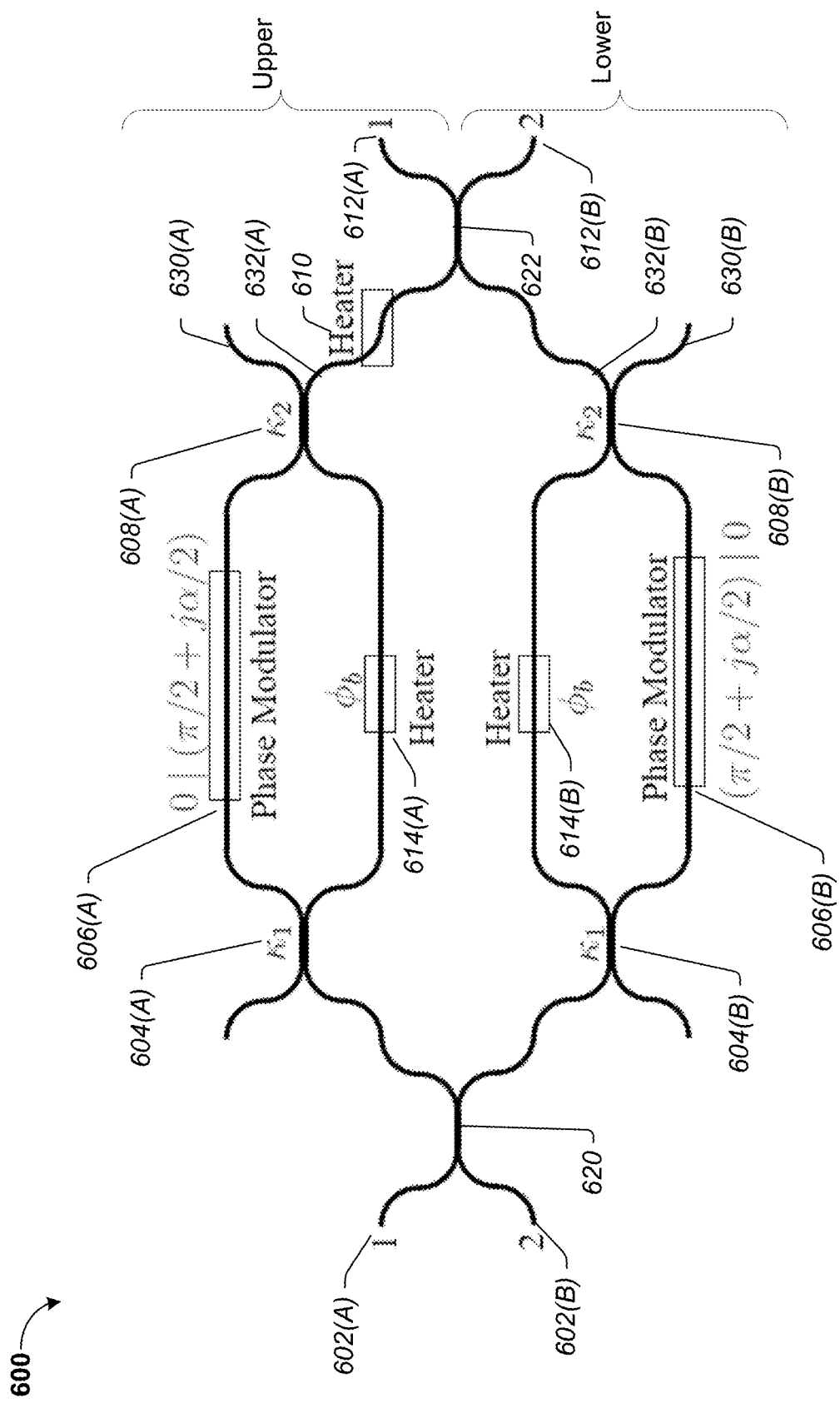
FIG. 6 illustrates a nested 2×2 Mach-Zehnder switch, consistent with an exemplary embodiment.

In some embodiments, the MZPM discussed herein can be implemented in a nested topology. To that end, FIG. 6 illustrates a 2×2 nested Mach-Zehnder switch (NMZS), consistent with an exemplary embodiment. The NMZS 600 includes two π/2 modulator blocks having an upper half and a lower half, which are mutually similar. The two halves can be viewed as Mach Zehnder Interferometer (MZI) blocks that have been matted together to form a complementary configuration. Accordingly, aspects of NMZS 600 will be discussed in the context of the upper half and not repeated for the bottom half for brevity. Some of the differences between the upper half and the lower half are discussed in a later section.

The NMZS 600 can be driven in a push-pull configuration. Phase modulator 606(A) may swing from 0 to π/2 while phase modulator 606(B) may swing from π/2 to 0.

There is a first optical coupler 620 configured to combine the light from the first input 602(A) with the second input 602(B). The upper MZI includes a second optical coupler 604(A) configured to split the light at the output of the first optical coupler 620 into a first optical path having a phase modulator 606(A) and a second optical path having a heater 614(A).

The second optical coupler 608(A) is configured to combine the first optical path having the phase modulator 606(A) and the second optical path having the heater 614(a). Each coupler 604(A) and 608(A) has its corresponding power coupling coefficient κ1 and κ2, respectively.

The first and second optical couplers are tuned via their coupling coefficients $\kappa_1$ and $\kappa_2$, respectively, such that the phase modulated optical signal at the second output 632(A) of the second optical coupler 608(A) provides a substantially constant amplitude that is independent of a change in loss introduced by the phase modulator 606(A). In one embodiment, all optical couplers (e.g., 620, 606(A), 606(B), 608

(A), 608(B), 620, and 622) could also be tunable so as to keep the device optimized over temperature and/or semiconductor lifetime degradation variations.

There is a fourth optical coupler 622 configured to combine the second output of the upper MZI block and the lower MZI block.

In one embodiment, there is a heater 610(A) coupled between the second optical coupler 608(A) and the fourth optical coupler 622, configured to provide a static phase of $\pi/2$. For example, it may be desired to have a phase difference of 0 or $\pi$ between the upper and lower MZI of 600. In this regard, if the phase difference is 0, then the signal at the first input 602(A) ultimately ends up at the second output 612(B). However, if the phase difference is it, then the signal at the first input 602(A) ultimately ends up at the first output 612(A).

In this regard, by way of illustrative example, FIG. 6 depicts the phase modulator 606(A) of the upper MZI to have two states: (i) 0, and (ii) $\pi/2+j\alpha/2$, while the phase modulator 606(B) of the lower MZI is depicted to have the same two states in reverse: (i) $\pi/2+j\alpha/2$, and (ii) 0. Put differently, when the NMZS 600 is in the first state, then the phase difference between the upper block and the lower block is provided by the relationship of equation 5 below:

Phase difference between Upper MZI and lower MZI=0 (from phase modulator 606($A$))+$\pi/2$ (from heater 610)–$\pi/2$ (from phase modulator 606($B$))=0   (Eq. 5)

Accordingly, when in the first state, the signal at the first input 602(A) ultimately ends up at the second output 612(B). However, when the NMZS 600 is in the second state, then the phase difference between the upper block and the lower block is provided by the relationship of equation 6 below:

Phase difference between Upper MZI and lower MZI=$\pi/2$ (from phase modulator 606($A$))+$\pi/2$ (from heater 610)–0 (from phase modulator 606($B$))=$\pi$   (Eq. 6)

Accordingly, when in the second state, the signal at the first input 602(A) ultimately ends up at the first output 612(A). Thus, by virtue of using the heaters 610, 614(A), and 614(B), as well as phase modulators 606(A) and 606(B), the path of the input signal may be controlled. Further, since the insertion loss in both the upper MZI is substantially similar to the insertion loss of the lower MZI, there is an excellent power balance between the upper block and the lower block, thereby removing optical crosstalk.

Figure 7:
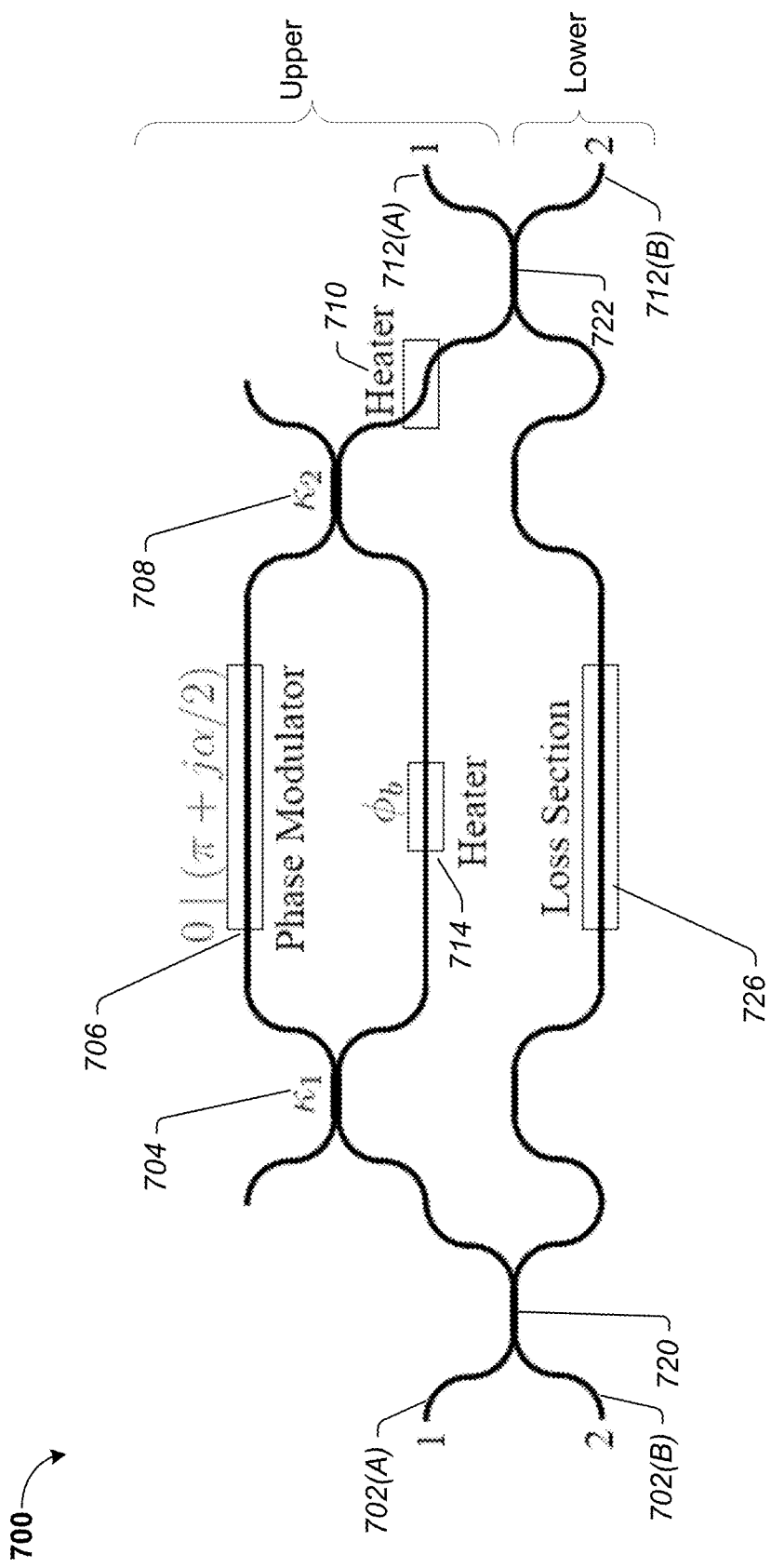
FIG. 7 illustrates a nested 2×2 Mach-Zehnder switch (NMZS), consistent with another exemplary embodiment.

FIG. 7 illustrates a nested 2×2 Mach-Zehnder switch (NMZS), consistent with another exemplary embodiment. The NMZS 700 includes two blocks, namely an upper block and a lower block, that are different from each other different. There is a first optical coupler 720 configured to combine the light from the first input 702(A) with the second input 702(B).

The upper MZI block includes a second optical coupler 704 configured to split the light at the output of the first optical coupler 720 into a first optical path having a phase modulator 706 and a second optical path having a heater 714.

The second optical coupler 708 of the upper MZI block is configured to combine the first optical path having the phase modulator 706 and the second optical path having the heater 714. Optical couplers 704 and 708 have their corresponding power coupling coefficient $\kappa_1$ and $\kappa_2$, respectively. The operation of the upper MZI block is similar to the upper MZI block of FIG. 6 and is therefore not repeated here for brevity.

There is a fourth optical coupler 722 configured to combine the second output of the upper MZI block and the output from the lower block. In one embodiment, there is a heater 710 coupled between the second optical coupler 708 and the fourth optical coupler 722. For example, this heater 710 can be used to correct for phase errors (e.g., due to fabrication imperfections).

The lower block includes a loss compensator 726 that is configured to match a loss incurred on the upper block. The loss compensator may be a fixed or tunable attenuator. For example, a tunable attenuator could be a forward biased pin diode, sometimes referred to as a variable optical attenuator (VOA). The fourth optical coupler 722 recombines the upper and lower blocks such that the phase shift generated by the phase modulator determines which output of the second optical coupler 722 is used. Since the insertion loss in both the upper MZI block and the lower block are substantially similar, there is an excellent power balance between the upper block and the lower block, thereby removing optical crosstalk.

It should be understood that, while the present optical phase modulator structures are shown as implementing a 2×2 optical switch, the present principles may be used to implement an optical phase modulator (e.g., optical switch) having any combination of M input ports and N output ports.

Example Process

Figure 8:
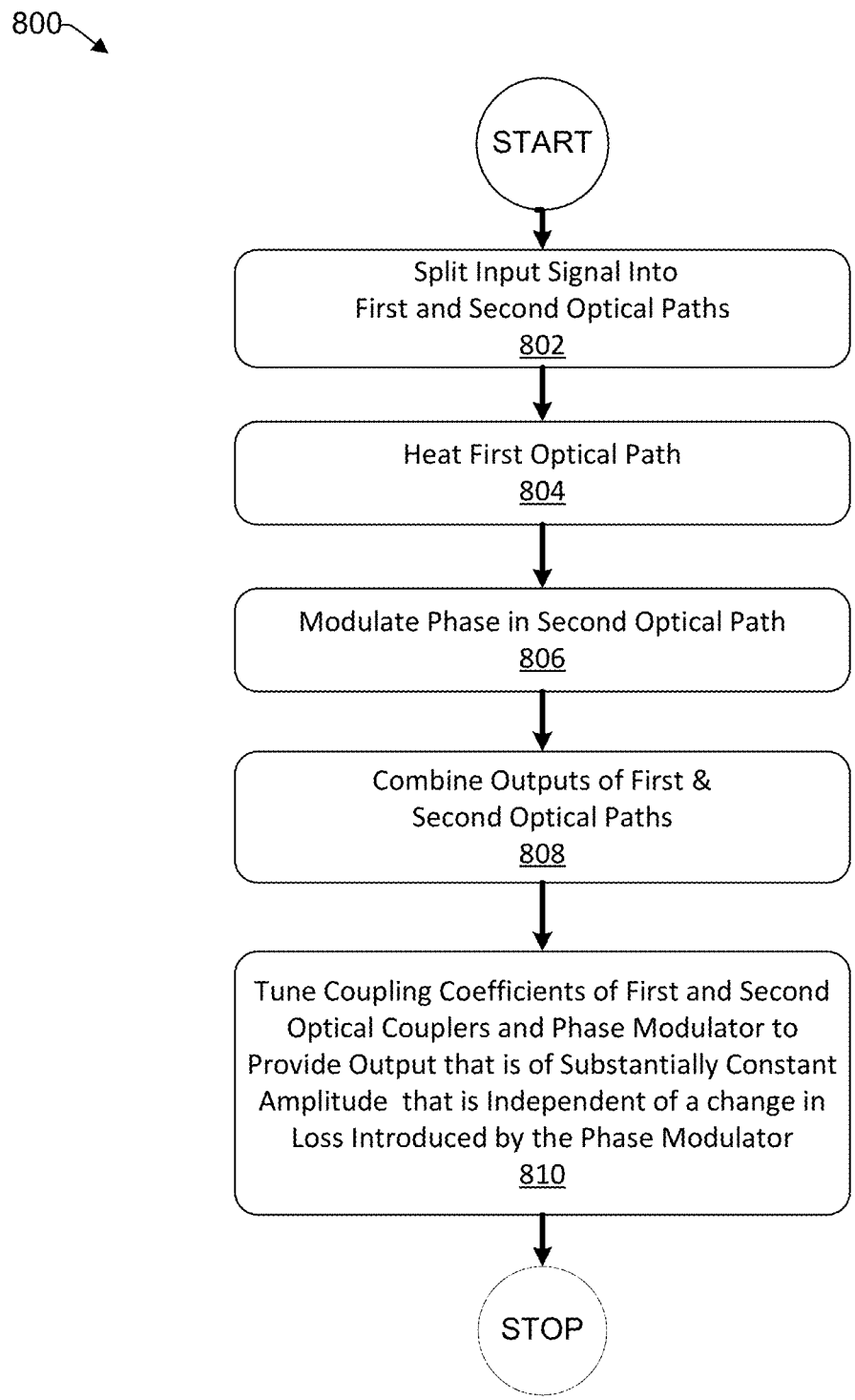
FIG. 8 presents an illustrative process for providing optical phase modulation while providing an amplitude that is independent of changes in loss introduced by the phase modulator.

With the foregoing overview of various MZPM architectures and configurations, it may be helpful now to consider a high-level discussion of an example process. To that end, FIG. 8 presents an illustrative process 800 for providing optical phase modulation while maintaining an amplitude that is independent of changes in loss introduced by the phase modulator.

Process 800 is illustrated as a collection of blocks in a logical flow that represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or performed in parallel to implement the process. For discussion purposes, the process 800 is described with reference to the MZPM 200 of FIG. 2.

At block 802, a light signal enters a first input source 202 of the MZPM 200 having a first optical path 218, a second optical path 220, a first optical coupler 214 and a second optical coupler 216. This input signal is split by the first optical coupler into the first optical path 218 and the second optical path 220.

At block 804, the first optical path 218 is heated such that it provides a static phase shift.

At block 806, the phase of the second optical path 212 is modulated by the phase modulator 212. In one embodiment, such swing may range from 0 to ($\phi+j\alpha/2$).

At block 808, the second optical coupler 216 combines the first optical path 218 and the second optical path 220.

At block 810, the coupling coefficient $\kappa_1$ of the first optical coupler 214 and the coupling coefficient $\kappa_2$ of the second optical coupler 216 are tuned such that an output (e.g., 206 or 208) of the second optical coupler 216 provides a substantially constant amplitude that is independent of a change in loss introduced by the phase modulator 212.

Example Computer Platform

Figure 9:
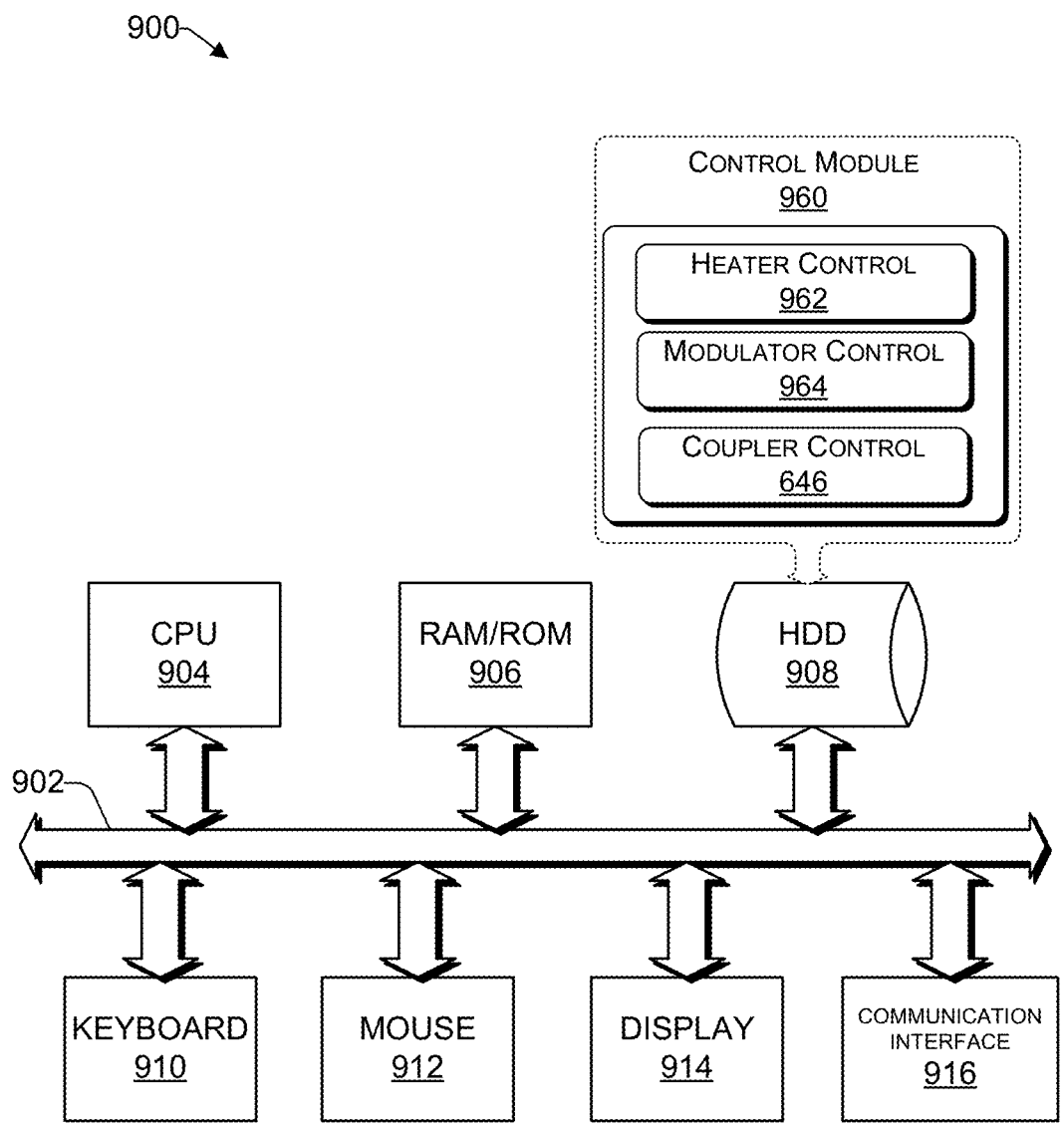
FIG. 9 provides a functional block diagram illustration of a computer platform that may be used to implement a control device that may be used to control a Mach-Zehnder phase modulator.

In some embodiments, functions relating to providing an optical phase modulator that has an output with a substantially constant amplitude that is independent of a change in loss introduced by the phase modulator, may be performed at least in part with the use of one or more computing devices. To that end, FIG. 9 provides a functional block diagram illustration of a computer platform that may be used to implement to control an MZPM.

The computer platform 900 may include a central processing unit (CPU) 904, random access memory (RAM) and/or read only memory (ROM) 906, a hard disk drive (HDD) 908, a keyboard 910, a mouse 912, and display 914, which are connected to a system bus 902.

In one embodiment, the HDD 908, has capabilities that include storing a program that can execute various processes, such as a control module 960 to control various aspects of a MZPM. The control module 960 may have various modules configured to perform different functions.

For example, the control module 960 may include a heater control module 942 operative to turn ON/OFF and control the phase adjustment of the various heaters discussed herein. There may be a modulator control module 964 operative to control the phase of the phase modulators of FIGS. 2, 5, 6, and 7. There may be a coupler control module 646 operative to tune the coupling coefficient of the optical couplers of FIGS. 2, 5, 6, and 7.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to process flow illustrations and/or block diagrams of a method, apparatus (systems), and computer program products according to embodiments of the present disclosure. It will be understood that each step of the process flow illustrations and/or block diagrams, and combinations of blocks in the process flow illustrations and/or block diagrams, can be implemented or controlled by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the process and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the process flow and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the process and/or block diagram block or blocks.

The process flow and block diagrams in the Figures illustrate the architecture, functionality, and operation of possible implementations of systems, methods, and computer program products according to various embodiments of the present disclosure. In this regard, each block in the process or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or illustration, and combinations of blocks in the block diagrams and/or illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An optical phase modulator, comprising:
an input port, configured to receive a light source;
an output port configured to provide a phase modulated output signal based on the received light source;
a first optical coupler coupled to the input port and configured to split the light source into a first optical path of a Mach Zehnder Interferometer (MZI) and a second optical path of the MZI;
a static phase shifter in the first optical path;
a phase modulator in the second optical path; and
a second optical coupler coupled to the output port and configured to combine the first optical path and the second optical path,
wherein the first and second optical couplers are adjusted such that the phase modulated optical signal at the output port provides a substantially constant amplitude that is independent of an insertion loss variation introduced by the phase modulator.

2. The optical phase modulator of claim 1, wherein the phase modulator is an electro-optic modulator that has a loss coefficient $\alpha$ when a voltage or a current is applied to the phase modulator.

3. The optical phase modulator of claim 1, wherein the insertion loss is traded for a substantial amplitude uniformity across a predetermined phase space.

4. The optical phase modulator of claim 1, wherein the phase modulator is configured to swing from 0 to $(\phi+j\alpha/2)$, where $\phi$ is a phase and $\alpha$ a loss coefficient of the phase modulator.

5. The optical phase modulator of claim 1, wherein:
the first optical coupler is a 2×2 coupler having a coupling coefficient $\kappa 1$; and,
the second optical coupler is a 2×2 coupler having a coupling coefficient $\kappa 2$.

6. The optical phase modulator of claim 1, wherein:
the first optical coupler has a first input coupled to the input port and a second input configured to monitor the MZI; and
the second optical coupler has a first output coupled to the output port and a second output configured to monitor the MZI.

7. The optical phase modulator of claim 1, wherein the phase modulator is implemented in at least one of:
Lithium Niobate (LN) waveguide devices using a Pockels effect;
III-V waveguide devices using a Franz-Keldysh (FK) or a Quantum-Confined Stark Effect (QCSE); and
silicon waveguide devices using a free-carrier plasma dispersion (FCD) effect.

8. An optical phase modulator comprising a cascade of a plurality of the optical phase modulators of claim 1.

9. The optical phase modulator of claim 1, wherein the first and second optical couplers are tuned via their coupling coefficients $\kappa 1$ and $\kappa 2$, respectively, such that the phase modulated optical signal at the output port provides the substantially constant amplitude that is independent of a change in loss introduced by the phase modulator.

10. A system for phase modulation, comprising:
an input port, configured to receive a light source;
an output port configured to provide a phase modulated output signal based on the received light source;
a first optical coupler coupled to the input port and configured to split the light source into a first optical path of a Mach Zehnder Interferometer (MZI) and a second optical path of the MZI;
a static phase shifter in the first optical path;
a phase modulator in the second optical path; and
a second optical coupler coupled to the output port and configured to combine the first optical path and the second optical path,
wherein the first and second optical couplers are adjusted such that the phase modulated optical signal at the output port provides a substantially constant amplitude that is independent of an insertion loss variation introduced by the phase modulator.

11. The system of claim 10, wherein the system is an electro-optic modulator that has a loss coefficient $\alpha$ when a voltage or a current is applied to the phase modulator.

12. The system of claim 10, wherein the insertion loss is traded for a substantial amplitude uniformity across a predetermined phase space.

13. The system of claim 10, wherein the phase modulator is configured to swing from 0 to $(\phi+j\alpha/2)$, where $\phi$ is a phase and $\alpha$ a loss coefficient of the phase modulator.

14. The system of claim 10, wherein:
the first optical coupler is a 2×2 coupler having a coupling coefficient $\kappa_1$; and,
the second optical coupler is a 2×2 coupler having a coupling coefficient $\kappa_2$.

15. The system of claim 10, wherein:
the first optical coupler has a first input coupled to the input port and a second input configured to monitor the MZI; and
the second optical coupler has a first output coupled to the output port and a second output configured to monitor the MZI.

16. The system of claim 10, wherein the phase modulator is implemented in at least one of:

Lithium Niobate (LN) waveguide devices using a Pockels effect;

III-V waveguide devices using a Franz-Keldysh (FK) or a Quantum-Confined Stark Effect (QCSE); and silicon waveguide devices using a free-carrier plasma dispersion (FCD) effect.

17. An optical switch, comprising:
an input comprising a first input port and a second input port;
an output comprising a first output port and a second output port;
a first optical coupler configured to combine a signal from the first input port and a signal from the second input port;
a second optical coupler coupled to a first output of the first optical coupler and configured to split a signal of the first output of the first optical coupler into a first optical path of an upper Mach Zehnder Interferometer (MZI) and a second optical path of the upper MZI;
a first static phase shifter configured to provide a static phase shift to the second optical path of the upper MZI;
a first phase modulator in the first optical path of the upper MZI;
a third optical coupler configured to combine the first optical path and the second optical path of the upper MZI,
a fourth optical coupler coupled to a second output of the first optical coupler and configured to split a signal of the second output of the first optical coupler into a first optical path of a lower MZI and a second optical path of the lower MZI;
a second static phase shifter configured to provide a static phase shift to the first optical path of the lower MZI;
a second phase modulator in the second optical path of the lower MZI;
a fifth optical coupler configured to combine the first optical path and the second optical path of the lower MZI; and
a sixth optical coupler configured to combine an output of the third optical coupler and an output of the fifth optical coupler,
wherein the second, third, fourth, and fifth optical couplers are adjusted such that a phase modulated optical signal at an output of the optical phase modulator provides a substantially constant amplitude that is independent of an insertion loss variation introduced by the first and an insertion loss variation of the second phase modulator.

18. The optical switch of claim 17, further comprising a third static phase shifter coupled between the third optical coupler and the sixth optical coupler and configured to provide a static phase of $\pi/2$.

19. The optical switch of claim 17, wherein the insertion loss of the first phase modulator is substantially similar to the insertion loss of the second phase modulator.

20. An optical switch, comprising:
an input comprising a first input port and a second input port;
an output comprising a first output port and a second output port;
a first optical coupler configured to combine a signal from the first input port and the second input port;
a second optical coupler coupled to a first output of the first optical coupler and configured to split a signal of the first output of the first optical coupler into a first optical path of an upper Mach Zehnder Interferometer (MZI) and a second optical path of the upper MZI;
a first phase modulator in the first optical path of the upper MZI;
a first phase shifter configured to provide a static phase shift to the second optical path of the upper MZI;
a third optical coupler configured to combine the first optical path and the second optical path of the upper MZI;
a loss compensator coupled to a second output of the first optical coupler and configured to match an amplitude loss incurred on the upper MZI; and
a fourth optical coupler configured to combine an output of the third optical coupler and an output of the loss compensator,
wherein the second and third optical couplers are adjusted such that a phase modulated optical signal at an output of the optical phase modulator provides a substantially constant amplitude that is independent of an insertion loss variation introduced by the first phase modulator.

21. The optical switch of claim 20, further comprising a second static phase shifter coupled between the third optical coupler and the fourth optical coupler.

22. A method of modulating an optical switch, comprising:
providing a Mach Zehnder Interferometer (MZI) having a first optical path, a second optical path, a phase modulator in the second optical path, a first optical coupler at an input of the MZI, and a second optical coupler at an output of the MZI;
splitting, by the first optical coupler, an input signal into the first optical path and the second optical path;
changing the effective path length in the first optical path such that it provides a static phase shift to the first optical path;
modulating the phase in the second optical path via a phase modulator;
combining, by the second optical coupler, an output of the first optical path and an output of the second optical path; and
tuning a coupling coefficient of the first optical coupler and a coupling coefficient of the second optical coupler such that an output of the second optical coupler provides a substantially constant amplitude that is independent of a change in loss introduced by the phase modulator.

23. The method of claim 22, wherein an insertion loss introduced by the phase modulator is traded for a substantial amplitude uniformity across a predetermined phase space.

24. The method of claim 22, further comprising swinging the phase modulator from 0 to $(\phi+j\alpha/2)$, where $\phi$ is a phase and $\alpha$ a loss coefficient of the phase modulator.

* * * * *